United States Patent [19]

Benzinger

[11] Patent Number: 4,551,686

[45] Date of Patent: Nov. 5, 1985

[54] COUPLING FILTER, ESPECIALLY AN INPUT FILTER, FOR RECEIVERS OF CENTRALIZED RIPPLE CONTROL SYSTEMS

[75] Inventor: Hans Benzinger, Duisburg, Fed. Rep. of Germany

[73] Assignee: Thielscher-Electronic GmbH, Fed. Rep. of Germany

[21] Appl. No.: 462,966

[22] Filed: Feb. 1, 1983

[30] Foreign Application Priority Data

Feb. 10, 1982 [DE] Fed. Rep. of Germany ....... 3204508
Apr. 7, 1982 [DE] Fed. Rep. of Germany ....... 3213098

[51] Int. Cl.⁴ .............................................. H03F 1/34
[52] U.S. Cl. .................................... 330/100; 330/107; 330/109; 330/167
[58] Field of Search ............... 330/100, 107, 109, 166, 330/167, 294

[56] References Cited

U.S. PATENT DOCUMENTS 3,461,398 8/1969 Gammel .......................... 330/100 X
4,015,224 3/1977 Benzinger ......................... 333/70 R

FOREIGN PATENT DOCUMENTS 1914893 12/1972 Fed. Rep. of Germany .
2436966 5/1977 Fed. Rep. of Germany .

OTHER PUBLICATIONS

Girling et al., "Active Filters: 7. The Two-Integrator Loop", *Wireless World*, Feb. 1970, pp. 76-80.
Sedra et al., "Optimum Configurations for Single-Amplifier Biquadratic Filters", *IEEE Transactions on Circuits and Systems*, vol. CAS-27, No. 12, Dec. 1980, pp. 1155-1163.
Perry, "New Multiple Feedback Active RC Network", *Electronics Letters*, vol. 11, No. 16, pp. 364-365, Aug. 7, 1975.
*Taschenbuch Elektrotechnik*, vol. 2, Informatik (Data Processing) by E. Philippow, Hanser Verlag, Munich and Vienna, 1977, p. 556.

*Primary Examiner*—James B. Mullins
*Attorney, Agent, or Firm*—Sixbey, Friedman & Leedom

[57] ABSTRACT

A coupling filter is formed from a plurality of four terminal networks. Each active four terminal network preferably has a bypass admittance, two filter admittances, a feedback admittance, and an amplifier. One end of the bypass admittance and of the filter admittances are connected to each other and to the input of the four terminal network, and one end of the feedback admittance is connected to the other end of the first filter admittance and to the input of the amplifier. The remaining ends of the second filter admittance and of the feedback admittance, as well as the output of the amplifier, are connected to each other and to the output of the four terminal network. Thus, except for the first four terminal network and the last four terminal network, the input of each four terminal network is connected by way of a coupling admittance to the output of the preceding four terminal network and said input is connected by way of a second coupling admittance to the output of the following four terminal network. Also the output of each four terminal network is connected on the one hand by way of a coupling admittance to the input of the preceding four terminal network and on the other hand by way of a second coupling admittance to the input of the following four terminal network.

22 Claims, 8 Drawing Figures

COUPLING FILTER, ESPECIALLY AN INPUT FILTER, FOR RECEIVERS OF CENTRALIZED RIPPLE CONTROL SYSTEMS

TECHNICAL FIELD

The invention relates to coupling filters generally, and particularly to an input filter for receivers of centralized ripple control systems, with a multiplicity of similar four terminal networks, every two adjacent four terminal networks being interconnected by means of two coupling admittances.

BACKGROUND ART

The point of departure for the invention is represented primarily by a known RC coupling filter in the form of a bandpass filter (see DE-AS No. 24 36 966). This known RC coupling filter is a double circuit active filter which affords a number of advantages.

Although excellent results have been obtained with the known double circuit RC coupling filter, it has been considered that further improvement in the properties could be achieved through series connection of several such double circuit RC coupling filters, and in particular an improved response time in comparison to a single double circuit RC coupling filter (again see DE-AS No. 24 36 966). Application of series connection of such double circuit RC coupling filters does, of course, create the problem that the coupling factors between the individual double circuit RC coupling filters are not determined by the relationship of the coupling components substantially or objectively present. Hence the problems connected with coupling factors which are eliminated with such series connections reappear to a certain extent, since the detuning coupling factors between the individual series components are as small differences in high frequencies very sensitive to variations in the elements.

LC coupling filters are also known; among others a double circuit LC coupling filter with passive LC four terminal networks (see DE-AS No. 19 14 893). In the case of these double circuit LC coupling filters, the coupling energy is exchanged back and forth between the two circuits by way of a single coupling element, specifically, through the mutual inductance which is inevitably present. In addition, multiple circuit LC coupling filters used as high frequency bandpass filters are known. These filters consist of coupled passive two terminal networks (see *Taschenbuch Electrotechnik* (Handy Reference Manual for Electrical Engineering), Volume 2, *Informatik* (Data Processing), by E. Philippow, Hanser Verlag, Munich and Vienna, 1977, page 556). The individual LC two terminal networks in such a known LC coupling filter may be designed as parallel circuits or, after appropriate conversion, as series circuits.

DISCLOSURE OF THE INVENTION

A primary aspect of the invention is the development of a multiple circuit (n circuit) coupling filter in which optimum selectivity and the shortest possible response times are combined with high stability (insensitivity to the coupling components employed).

Another aspect of the invention is to provide a coupling filter which, in its first version, is characterized by the fact that active RC four terminal networks are provided as four terminal networks. Each active RC four terminal network preferably has a bypass admittance, two filter admittances, a feedback admittance, and an amplifier. One end of the bypass admittance and of the filter admittances are connected to each other and to the input of the RC four terminal network, and one end of the feeback admittance is connected to the other end of the first filter admittance and to the input of the amplifier. The remaining ends of the second filter admittance and of the feedback admittance, as well as the output of the amplifier, are connected to each other and to output of the RC four terminal network. Thus, except for the first RC four terminal network and the last RC four terminal network, the input of each RC four terminal network is connected by way of a coupling admittance to the output of the preceding RC four terminal network and said input is connected by way of a second coupling admittance to the output of the following RC four terminal network. Also, the output of each RC four terminal network is connected on the one hand by way of a coupling admittance to the input of the preceding RC four terminal network and on the other hand by way of a second coupling admittance to the input of the following RC four terminal network. Unless expressly stated otherwise, when reference is made here and in what follows to the amplifier input, the inverting input of the amplifier is meant. Unless expressly stated otherwise, the noninverting input of the amplifier is in this case connected to the ground.

Another feature of the multiple circuit RC coupling filter of the invention is that the n RC four terminal networks form a continuous chain and are interconnected by means of interlaced feedbacks. The connection of the first and last RC four terminals includes, specifically, that the output of the first RC four terminal network is connected by way of a coupling admittance to the input of the second RC four terminal network, and the input of the first RC four terminal network is connected by way of another coupling admittance to the output of the second RC four terminal network. Also, the output of the last RC four terminal network is connected by way of a coupling admittance to the input of the next to last RC four terminal network, and the input of the last RC four terminal network is connected by way of another coupling admittance to the output of the next to last RC four terminal network.

Another aspect of the invention is to provide a coupling filter as indicated in the foregoing which makes it possible to use virtually all types of RC four terminal networks. The type of RC four terminal network employed then defines the nature of the entire RC coupling filter. In point of stability, the RC coupling filter of this invention is absolutely equivalent to the state of the art double circuit RC bandpass filter of the type previously indicated, since all coupling factors represent quotients of coupling components of the same type, so that variations in the coupling components employed have virtually no effect on the coupling factors. It is an aspect of particular significance that all the coupling admittances can be embodied in passive coupling components, specifically, coupling resistances or coupling capacitors.

An additional aspect of the invention is to provide a multiple circuit RC coupling filter wherein the signal to be filtered is fed into the first RC four terminal network, while output of the filtered signal takes place in the last RC four terminal network. The same alternatives as for the input circuits for the state of the art double circuit RC coupling filter apply to the input circuits, which in many cases have an input current converter. In many cases the signal to be filtered is introduced directly into the inverting input of the amplifier of the first RC four terminal network. It is especially advantageous, however, if the signal to be filtered is introduced into the noninverting input of the amplifier of the first RC four terminal network. This ensures that the symmetry of the RC four terminal networks is not disrupted by the input. It has already been pointed out that the admittances generally can be embodied in resistances or capacitances. The admittances may be embodied in ohmic resistances or in capacitors in keeping with the filter characteristics which it is desired to obtain. If, for example, for the purpose of design as a bandpass, the bypass admittance and the feedback admittance in each RC four terminal network are embodied in ohmic resistances and the filter admittances in capacitances, it is advisable for the coupling admittances to be embodied in capacitors. This design is particularly advantageous, since the RC coupling filter claimed for the invention as a whole is particularly well suited to the production of extremely narrow passbands.

In a further aspect of the invention, if the RC coupling filter is designed as a bandpass filter, it may be treated as a truly closed reactance four terminal network, provided that the RC four terminal networks, except the first RC four terminal network and the last RC four terminal network, are fully loss compensated. Loss compensation such as this of the "internal" RC four terminal networks can be accomplished by connecting the noninverting input of the amplifier of each RC four terminal network, except the first RC four terminal network and last RC four terminal network, by way of a first tuning admittance to the output of the amplifier and by way of a second tuning admittance to the ground. The tuning admittances are in this case preferably embodied in ohmic resistances. The tuning admittances can be adjusted so that the internal losses of the corresponding RC four terminal networks become negligibly small. Hence the "interior" RC four terminal networks are in effect fully loss compensated, so that the number of pole losses can be reduced to two. The RC coupling filter, as a narrow bandpass filter, is thus considerably more stable than any other comparable circuit.

In an alternative aspect of the invention to the embodiment indicated in the foregoing, with appropriate tuning admittances in the "interior" RC four terminal networks, a truly closed reactance four terminal network can also be produced if each of the RC four terminal networks is designed as a resonator with two amplifiers the inverting inputs of which are interconnected. Resonators of this type are already known as such. They are characterized by extremely low losses, and thus by very slight attenuation at the corresponding frequency. In addition, such resonators are even more insensitive to variations in the elements, and thus are even stabler, since they are characterized by a very high open loop voltage gain because of the two amplifiers.

A still further aspect of the invention is to provide additional circuit potential by designing each RC four terminal network as a multiple stage universal circuit, preferably with a summing stage, two integrating stages, and an inverting stage. A multiple stage universal circuit such as this presents the advantage that the possible inputs and outputs are assigned in advance. Different filter characteristics can be obtained through selection of different inputs or outputs. Such universal circuits are known, for example, as integrated capacitor switch filters in CMOS technology. Such capacitor switch filters have a clock crystal and are thus frequency constant to an extreme degree. Optimum utilization of the advantageous embodiment of the RC coupling filter with the highly stable coupling factor can be achieved precisely with these filters.

Another aspect of the invention is to provide a multiple circuit RC coupling filter which may, through appropriate adjustment of the individual admittances in keeping with the design, produce all special types of filters such as Bessel filters, Butterworth filters, Tschebyscheff filters, and so forth.

A further aspect of this invention is to provide a coupling filter which is characterized by the fact that active LC four terminal networks are provided as four terminal networks, that each active LC four terminal network has at least one filter inductance, one filter capacitance, and one amplifier, and that every two adjacent LC four terminal networks are connected to each other by way of the filter inductances. The active LC four terminal networks provided in this version of the coupling filter of the invention have a design corresponding to that of the RC four terminal networks of the previously discussed version of a coupling filter. These LC four terminal networks may be designed as series circuits or as parallel circuits, an aspect which requires no detailed elucidation. The adjacent LC four terminal networks are coupled to each other by way of the pertinent filter inductances or the corresponding mutual inductances, as is already known in the case of passive LC coupling filters. It is advisable to provide a bypass resistance and a filter resistance in each LC four terminal network in addition to the ohmic resistance associated with the filter inductance, which resistance must of necessity be present. It is also advisable for the bypass resistance to be designed as a two wire copper resistance, while the filter resistance is to be designed preferably as a metal film resistance. Temperature effects are thereby avoided. In the same manner as indicated previously for the RC four terminal networks of the previously described RC coupling filter, with each of the LC four terminal networks of the LC coupling filter of the invention, the inverting input of the amplifier may also be connected by way of a first tuning resistance to the output of the amplifier and by way of a second tuning resistance to the ground. It is recommended that the input of the signal to be filtered be introduced by way of the filter inductance of the first LC four terminal network, while it is advisable for output of the filtered signal to be effected by way of the filter capacitance of the last LC four terminal network.

In what follows the invention is described with reference to a drawing which illustrates only examples of embodiment:

BEST MODE FOR CARRYING OUT THE INVENTION

Figure 5:
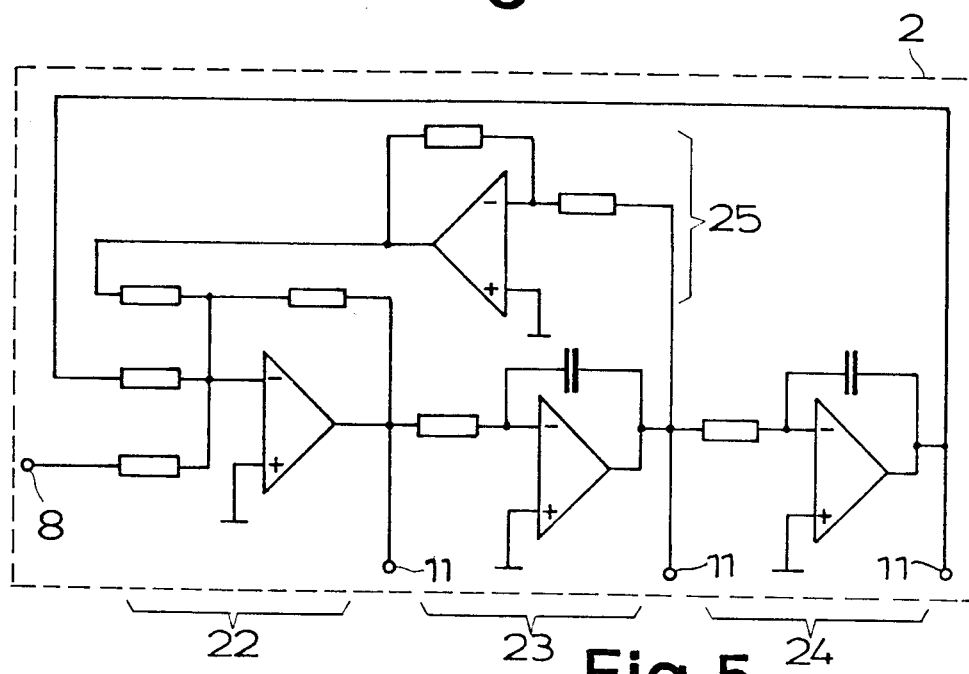
FIG. 5 shows a connection diagram of a universal circuit for an RC four terminal network as shown in FIG. 1.
Figure 6:
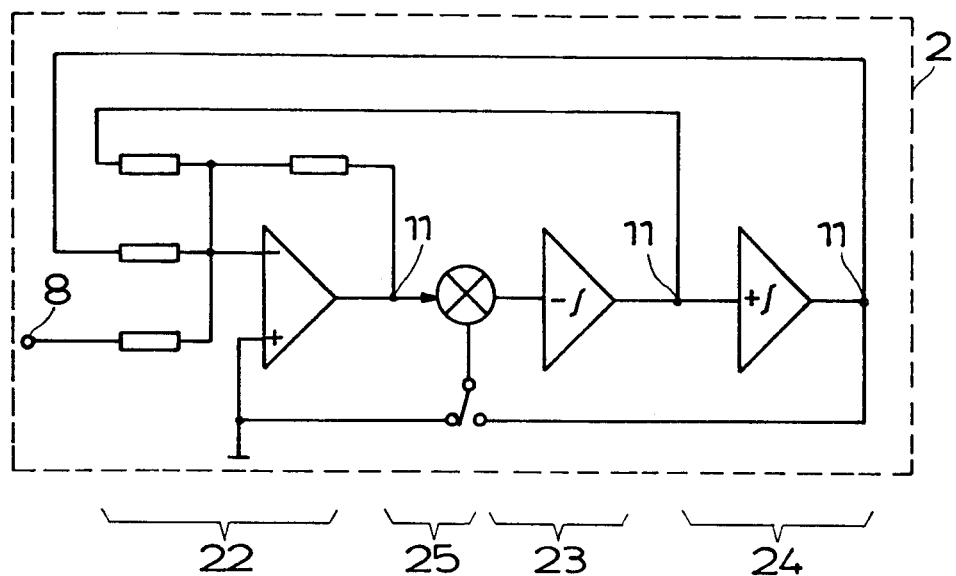
FIG. 6 shows a connection diagram of a special embodiment of the universal circuit shown in FIG. 5.
Figure 7:
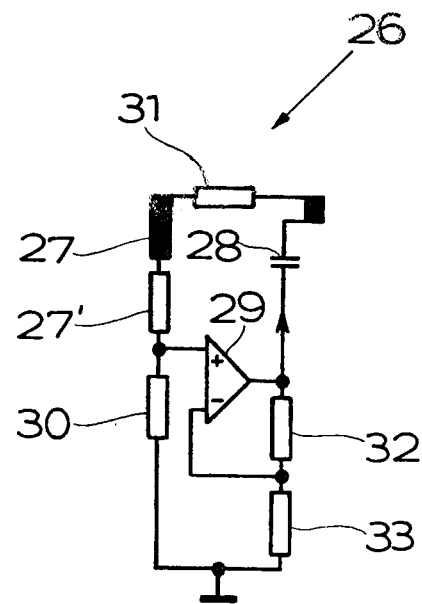
FIG. 7 shows a connection diagram of an LC four terminal network used in a coupling filter as claimed for the invention.
Figure 8:
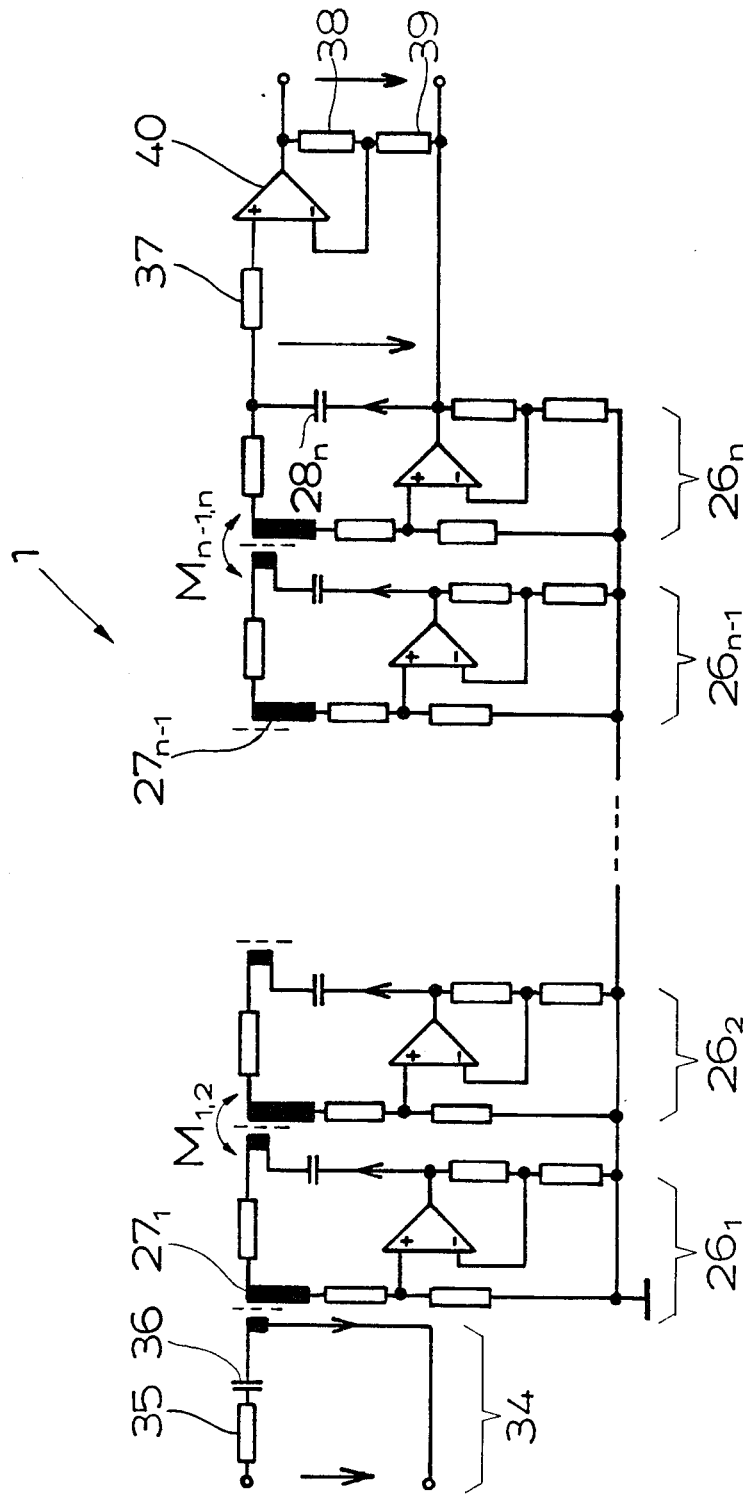
FIG. 8 shows a connection diagram of a multiple circuit coupling filter with LC four terminal networks as claimed for the invention.

Multiple circuit coupling filters, specifically, n circuit coupling filters 1 are shown in the figures, FIGS. 1 to 6 referring to RC coupling filters 1 and FIGS. 7 and 8 to LC coupling filters 1.

Figure 1:
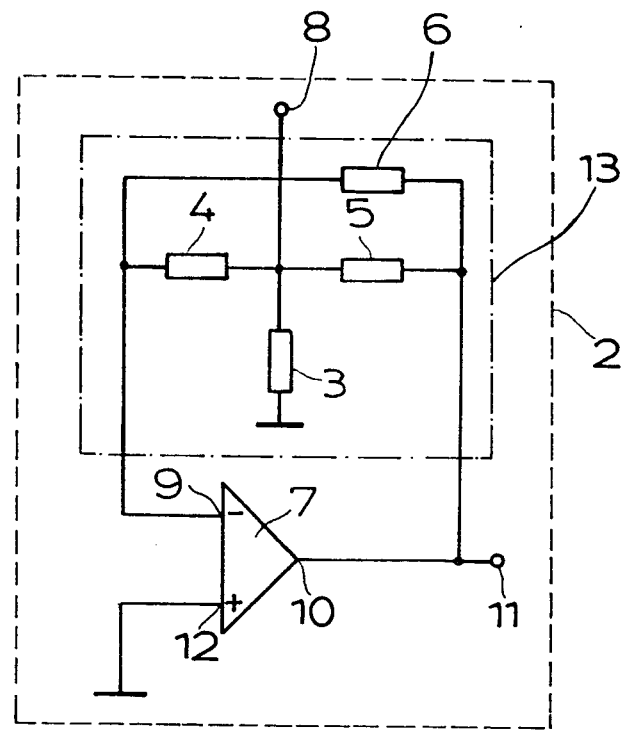
FIG. 1 shows a connection diagram of an RC four terminal network used in a coupling filter claimed for the invention.
Figure 2:
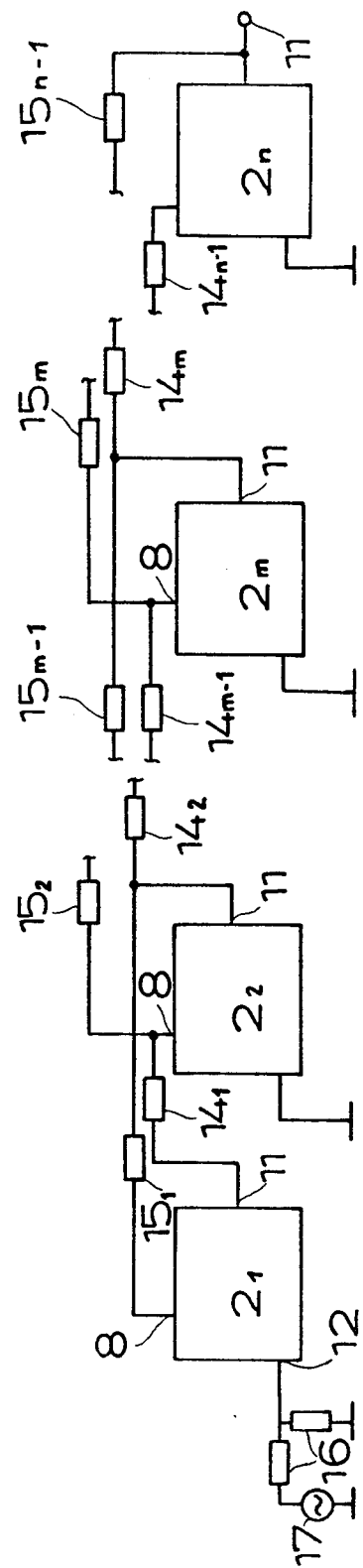
FIG. 2 shows a connection diagram of a multiple circuit coupling filter with RC four terminal networks as claimed for the invention.

As is to be seen from FIG. 2, the coupling filter 1 has a multiplicity of active RC four terminal networks 2 of the same type. An active RC four terminal network 2 such as this is illustrated in FIG. 1. This RC four terminal network 2 has a bypass admittance 3, two filter admittances 4, 5, a feedback admittance 6, and an amplifier 7. The bypass admittance 3 and the filter admittances 4, 5 are connected at one end to each other and to the input 8 of the RC four terminal network 2. The feedback admittance 6 is at one end connected to the other end of the first filter admittance 4 and to the input (inverting input) 9 of the amplifier 7. The other ends of the second filter admittance 5 and of the feedback admittance 6, as well as the output 10 of the amplifier 7, are connected to each other and to the output 11 of the RC four terminal network 2. In addition, in the embodiment shown the noninverting input 12 of the amplifier 7 is connected to the ground. The bypass admittance 3, the filter admittances 4, 5 and the feedback admittance 6 together make up the negative feedback admittance 13.

As is shown in FIG. 2, n active RC four terminal networks 2 are assembled to form an RC coupling filter 1. Two active RC four terminal networks 2 are interconnected in this case by way of two coupling admittances 14, 15. In particular, except for the first RC four terminal network $2_1$ and the last RC four terminal network $2_n$, the input 8 of each RC four terminal network $2_m$ is connected on the one hand by way of a coupling admittance $14_{m-1}$ to the output 11 of the preceding RC four terminal network $2_{m-1}$, and on the other, by way of another coupling admittance $15_m$, to the output of the following RC four terminal network $2_{m+1}$, and the output 11 of each RC four terminal nework $2_m$ is connected, on the one hand, by way of a coupling admittance $15_{m-1}$ to the input 8 of the preceding RC four terminal network $2_{m-1}$, and on the other, by way of another coupling admittance $14_m$, to the input of the following RC four terminal network $2_{m+1}$. The first RC four terminal network $2_1$ is, of course, connected only to the second RC four terminal network $2_2$, and the last RC four terminal network is, of course, connected only to the next to last RC four terminal network $2_{n-1}$. The subscript "m" always stands for a number between 1 and n, and thus always designates an "interior" RC four terminal network 2.

The RC four terminal networks 2 so to speak form a continuous chain with interlaced feedbacks by way of the coupling admittances 14 and 15. Like the bypass admittance 3, the filter admittances 4, 5, and the feedback admittance of each RC four terminal network 2, so also the coupling admittances 14, 15 may be designed as resistances or as capacitors.

As is clearly shown by FIG. 2, in the embodiment of an RC coupling filter 1 here illustrated, the signal to be filtered is introduced into the noninverting input 12 of the amplifier 7 of the first four terminal network $2_1$, specifically, by way of the input voltage divider 16 by means of a signal source 17. The filtered signal is tapped at the output of the last RC four terminal network $2_n$.

For the purpose of design as a bandpass filter, the bypass admittance 3 and the feedback admittance 6 may each be embodied in ohmic resistances, and the filter admittances 4, 5 in capacitors. In this case, however, the coupling admittances 14, 15 must also be embodied in capacitors.

Figure 3:
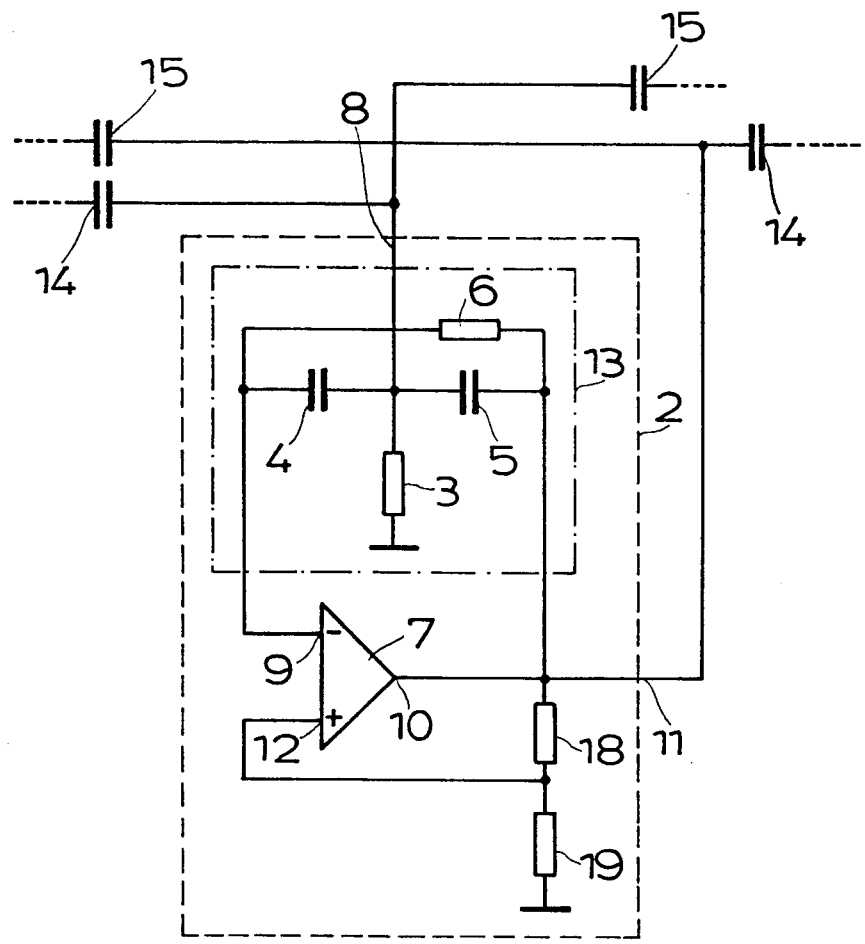
FIG. 3 shows a connection diagram of the RC four terminal network shown in FIG. 1, as modified among other things for production of a bandpass filter.

A corresponding example of embodiment of an RC four terminal network 2 for production of a bandpass filter is shown in FIG. 3. The RC four terminal network 2 illustrated in FIG. 3 has an additional distinctive feature in that the noninverting input 12 of the amplifier 7 is connected by way of a first tuning admittance 18 to the output 10 of the amplifier 7 and by way of a second tuning admittance 19 to the ground. Tuning admittances 18, 19 are, in this instance, embodied in ohmic resistances. This circuit arrangement is applicable to all "interior" RC four terminal networks $2_m$ and permits production of an RC coupling filter 1 in the form of a truly closed reactance four terminal network.

With an RC coupling filter 1 such as this the internal losses of the individual RC four terminal networks $2_m$ can be rendered in effect negligibly small through adjustment of the tuning admittances 18, 19.

The coupling factors $k_{m,m+1}$ represent quotients of elements of the same type and are thus highly stable toward variation in the elements. In the present case, for example, for $k_{m,m+1}$ we have:

$$k_{m,m+1} = \frac{C_{m,m+1}}{C} \frac{C_{m,m+1}}{\sqrt{C_{m5} \cdot C_{(m+1)5}}}.$$

$C_{m,m+1}$ in this case denotes the capacitance of the capacitor functioning as coupling admittance between the m-th RC four terminal network $2_m$ and the (M+1)-th RC four terminal network $2_{m+1}$, and $C_{m5}$ and $C_{(m+1)5}$ respectively represent the capacitances of the corresponding filter admittances $5_m$ and $5_{m+1}$ between the input 8 and the output 11 of the corresponding RC four terminal network $2_m$ or $2_{m+1}$.

Figure 4:
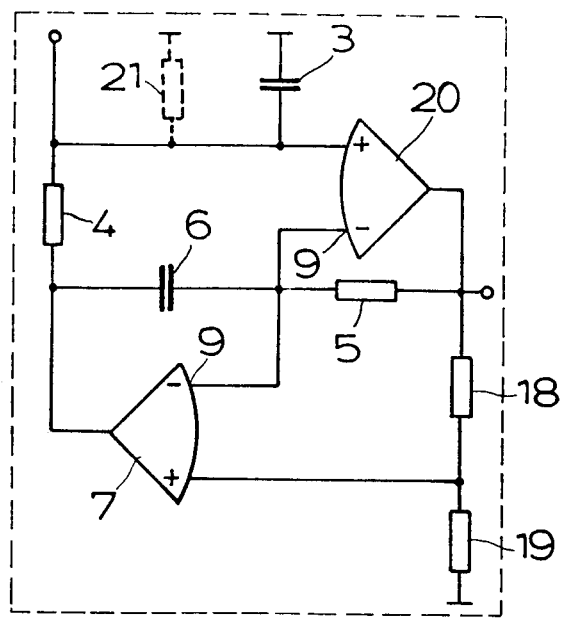
FIG. 4 shows a connection diagram of an RC four terminal network as shown in FIG. 1, designed as a resonator.

FIG. 4 shows the connection diagram of an RC four terminal network 2 designed as a resonator. The same reference symbols have been employed to the extent that the elements of the circuit correspond approximately to the elements already described. This RC four terminal network 2 designed as a resonator has two amplifiers 7, 20 the inverting inputs 9 of which are interconnected. It can be loss compensated in a simple manner by omitting the input resistance 21, if such is required. If the input resistance 21 is present, it must be connected to the ground parallel to the bypass admittance 3. Only in the case of the first RC four terminal network $2_1$ is the input resistance $21_1$ not connected to the ground, since the signal to be filtered is introduced by way of this resistance.

FIG. 5 shows a universal circuit for an RC four terminal network 2 as shown in FIG. 1, which is of multiple stage design, having a summing stage 22, two integrating stages 23, 24, and an inverting stage 25. Different filter characteristics can be achieved, depending on the particular one of outputs 11 which is dealt with.

A special embodiment of the universal circuit as shown in FIG. 5 is illustrated in FIG. 6. It is a question here of a so-called capacitor switch filter, which can be integrated into CMOS technology.

FIG. 7 shows an LC four terminal network 26, which can be employed in an LC coupling filter 1. This LC four terminal network 26 represents an active LC four terminal network with a filter inductance 27, an associated inductive resistance 27', a filter capacitance 28, an amplifier 29, a bypass resistance 30, a filter resistance 31, a first tuning resistance 32, and a second tuning resistance 33. The filter inductance 27 is connected on the one hand to the noninverting input of the amplifier 29, and on the other to the filter resistance 31, while the filter capacitance 28 is connected on the one hand to the output of the amplifier 29, and on the other to the other end of the filter resistance 31. The bypass resistance 30 is positioned between the noninverting input of the amplifier 29 and the ground, while the inverting input of the amplifier 29 is connected by way of the first tuning resistance 32 to the output of the amplifier 29 and by way of the second tuning resistance 33 to the ground.

The bypass resistance 30 is designed as a two wire copper resistive element, while the filter resistance 31 is designed as a metal film resistive element.

As is clearly shown in FIG. 8, adjacent LC four terminal networks 26 are coupled by way of the filter inductances 27.

Input of the signal to be filtered is effected in the case of the LC coupling filter 1, as is shown in FIG. 8, by way of an input circuit 34, by way of an input resistance 35, and an input capacitance 36, into the filter inductance 27₁ of the first LC four terminal network 26₁. Output of the filtered signal is effected from the filter capacitance of the last LC four terminal network 26ₙ by way of an output resistance 37 and by way of an amplifier 40 balanced by way of balancing resistances 38, 39.

In this case as well the coupling factors $k_{m,m+1}$ represent quotients of elements of the same type and thus are highly stable toward variations in the elements. In the present case, for example, for $k_{m,m+1}$ we have:

$$K_{m,m+1} = \frac{M_{m,m+1}}{L} = \frac{M_{m,m+1}}{\sqrt{L_m \cdot L_{m+1}}}$$

$M_{m,m+1}$ in this case denotes the mutual inductance of the filter inductance $L_{m+1}$ performing the function of coupling element between the m-th LC four terminal network $26_m$ and the (m+1)-th LC four terminal network $26_{m+1}$, and $L_m$ and $L_{m+1}$ are the filter inductances of the corresponding LC four terminal networks $26_m$ and $26_{m+1}$.

For a further discussion of the theory underlying this invention and for a further description of circuitry for implementing this invention reference is made to the following appendix.

I claim:

1. A coupling filter, especially an input filter for receivers of centralized ripple control systems, with a multiplicity of similar four terminal networks (2), each four terminal network (2) having an input (8) and an output (11) and every two adjacent four terminal networks (2) being interconnected by means of two coupling admittances (14,15), wherein active RC four terminal networks (2) with at least one amplifier (7) are provided as four terminal networks, wherein the output (11) of the first RC four terminal network (2₁) is connected by way of a coupling admittance (14₁) to the input (8) of the second RC four terminal network (2₂) and the input (8) of the first RC four terminal network (2₁) is connected by way of another coupling admittance (15₁) to the output (11) of the second RC four terminal network (2₂), wherein, except for the first RC four terminal network (2₁) and the last RC four terminal network (2ₙ), the input (8) of each RC four terminal network (2ₘ) is connected on the one hand by way of a coupling admittance (14ₘ₋₁) to the output (11) of the preceding RC four terminal network (2ₘ₋₁), and on the other, by way of another coupling admittance (15ₘ) to the output (11) of the following RC four terminal network (2ₘ₊₁), and the output of each RC four terminal network (2ₘ) is connected, on the one hand, by way of a coupling admittance (15ₘ₋₁) to the input (8) of the preceding RC four terminal network (2ₘ₋₁), and on the other, by way of another coupling admittance (14ₘ), to the input of the following RC four terminal network (2ₘ₊₁), and wherein the output (11) of the last RC four terminal network (2ₙ) is connected by way of a coupling admittance (15ₙ₋₁) to the input of the next to last RC four terminal network (2ₙ₋₁) and the input (11) of the last RC four terminal network (2ₙ) is connected by way of another coupling admittance (14ₙ₋₁) to the output (11) of the next to last RC four terminal network (2ₙ₋₁).

2. The coupling filter as claimed in claim 1 wherein the signal to be filtered is introduced into the noninverting input (12) of the amplifier (7) of the first RC four terminal network (2₁).

3. The coupling filter as claimed in claim 2, wherein with the exception of the first RC four terminal network (2₁) and the last RC four terminal network (2ₙ), the noninverting input (12) of the amplifier (7) of each RC four terminal network (2ₘ) is connected by way of a first tuning admittance (18) to the output (10) of the amplifier (7) and by way of a second tuning admittance (19) to the ground.

4. The coupling filter as claimed in claim 3, wherein the tuning admittances (18,19) are embodied in ohmic resistances.

5. The coupling filter as claimed in claim 2, wherein each RC four terminal network (2) is designed as a resonator with two amplifiers (7,20) the inverting inputs (9) of which are interconnected.

6. The coupling filter as claimed in claim 1, wherein with the exception of the first RC four terminal network (2₁) and the last RC four terminal network (2ₙ), the noninverting input (12) of the amplifier (7) of each RC four terminal network (2) is connected by way of a first tuning admittance (18) to the output (10) of the amplifier (7) and by way of a second tuning admittance (19) to the ground.

7. The coupling filter as claimed in claim 4, wherein the tuning admittances (18,19) are embodied in ohmic resistances.

8. The coupling filter as claimed in claim 1, wherein each RC four terminal network (2) is designed as a resonator with two amplifiers (7,20), the inverting inputs (9) of which are interconnected.

9. The coupling filter as claimed in claim 1, wherein each active, RC four terminal network (2) has a bypass admittance (3) two filter admittances (4,5) and a feedback admittance (6), the bypass admittance (3) and the filter admittances (4,5) are connected at one end to each other and to the input (8) of the RC four terminal network (2), the feedback admittance (6) is at one end connected to the other end of the first filter admittance (4) and to the input (9) of the amplifier (7), and the other ends of the second filter admittance (5) and of the feedback admittance (6), as well as the output (10) of the amplifier (7), are connected to each other and to the output (11) of the RC four terminal network (2).

10. The coupling filter as claimed in claim 9, in which, for the purpose of design as a bandpass filter, in each RC four terminal network (2) the bypass admittance (3) and feedback admittance (6) is each embodied in an ohmic resistance and the filter admittances (4,5) in capacitors, where the coupling admittances (14,15) are embodied in capacitors.

11. The coupling filter as claimed in claim 3, wherein, with the exception of the first RC four terminal network ($2_1$) and the last RC four terminal network ($2_n$), the noninverting input (12) of the amplifier (7) of each RC four terminal network ($2_m$) is connected by way of a first tuning admittance (18) to the output (10) of the amplifier (7) and by way of a second tuning admittance (19) to the ground.

12. The coupling filter as claimed in claim 11, wherein the tuning admittances (18,19) are embodied in ohmic resistances.

13. The coupling filter as claimed in claim 9, in which, for the purpose of design as a bandpass filter, in each RC four terminal network the bypass admittance and the feedback admittance is embodied in an ohmic resistance and the filter admittances in capacitors, wherein the coupling admittances (14, 15) are embodied in capacitors.

14. The coupling filter as claimed in claim 1, wherein each RC four terminal network (2) is designed as a multiple stage universal circuit with a summing stage (22), two integrating stages (23,24), and an inverting stage (25).

15. The coupling filter as claimed in claim 14, wherein an integrated capacitor switch filter is provided as the universal circuit.

16. A coupling filter especially an input filter for receivers of centralized ripple control systems, with a multiplicity of similar four terminals networks, every two adjacent four terminal network being interconnected by means of coupling admittances wherein active LC four terminal networks (26) are provided as the four terminal networks, wherein each active LC four terminal network (26) has at least one filter inductance (27), one filter capacitance (28), one amplifier (29), a bypass resistance (30) and a filter resistance (31), wherein the bypass resistance (30) is connected between the input of the amplifier (29) and the ground, wherein the filter inductance (27), the filter resistance (31) and the filter capacitance (28) are connected in series as a feedback path for the amplifier (29), and wherein every two adjacent LC four terminal networks (26) are only inductance-connected to each other by way of the filter inductances (27).

17. The coupling filter as claimed in claim 7, wherein the bypass resistance (30) is designed as a two wire copper resistance and the filter resistance (31) as a metal film resistance.

18. The coupling filter as claimed in claim 8, wherein the inverting input of the amplifier (29) is connected by way of a first tuning resistance (32) to the output of the amplifier (29) and by way of a second tuning resistance (33) to the ground.

19. The coupling filter as claimed in claim 8, wherein input of a signal to be filtered is effected by way of the filter inductance ($27_1$) of the first LC four terminal network ($26_1$) and output of the filtered signal is effected by way of the filter capacitance ($28_n$) of the last LC four terminal network ($26_n$).

20. The coupling filter as claimed in claim 7, wherein the inverting input of the amplifier (29) is connected by way of a first tuning resistance (32) to the output of the amplifier (29) and by way of a second tuning resistance (33) to the ground.

21. The coupling filter as claimed in claim 9, wherein input of a signal to be filtered is effected by way of the filter inductance ($27_1$) of the first LC four terminal network ($26_1$) and output of the filtered signal is effected by way of the filter capacitance ($28_n$) of the last LC four terminal network ($26_n$).

22. The coupling filter as claimed in claim 7 wherein input of a signal to be filtered is effected by way of the filter inductance ($27_1$) of the first LC four terminal network ($26_1$) and output of the filtered signal is effected by way of the filter capacitance ($28_n$) of the last LC four terminal network ($26_n$).

* * * * *